(12) United States Patent
Gao et al.

(10) Patent No.: US 11,522,029 B2
(45) Date of Patent: Dec. 6, 2022

(54) DISPLAY BACKPLATE AND MANUFACTURING METHOD THEREOF, AND DISPLAY DEVICE

(71) Applicant: BEIJING BOE TECHNOLOGY DEVELOPMENT CO., LTD., Beijing (CN)

(72) Inventors: Xinwei Gao, Beijing (CN); Dandan Zang, Beijing (CN); Peng Li, Beijing (CN); Qihe Chen, Beijing (CN); Chin Lung Liao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 58 days.

(21) Appl. No.: 17/041,495

(22) PCT Filed: Mar. 2, 2020

(86) PCT No.: PCT/CN2020/077454
§ 371 (c)(1),
(2) Date: Sep. 25, 2020

(87) PCT Pub. No.: WO2020/238308
PCT Pub. Date: Dec. 3, 2020

(65) Prior Publication Data
US 2021/0210570 A1 Jul. 8, 2021

(30) Foreign Application Priority Data
May 30, 2019 (CN) .......................... 201910461711.1

(51) Int. Cl.
*H01L 27/32* (2006.01)
*H01L 51/56* (2006.01)
*H01L 51/00* (2006.01)

(52) U.S. Cl.
CPC .......... *H01L 27/3246* (2013.01); *H01L 51/56* (2013.01); *H01L 51/0005* (2013.01)

(58) Field of Classification Search
None
See application file for complete search history.

(56) References Cited

U.S. PATENT DOCUMENTS 7,547,920 B2   6/2009  Lee et al.
9,929,342 B2 *  3/2018  Dai ............................ B41J 2/01
(Continued)

FOREIGN PATENT DOCUMENTS

CN   107623082 A   1/2018
CN   108346680 A   7/2018
(Continued)

OTHER PUBLICATIONS

First Official Action issued in Chinese Patent Application No. 201910461711.1, dated (2019).
(Continued)

*Primary Examiner* — Michelle Mandala
(74) *Attorney, Agent, or Firm* — Chiwin Law LLC

(57) ABSTRACT

A display backplate and a manufacturing method thereof, and a display device are provided. The display backplate includes a base substrate and a pixel defining layer provided on the base substrate, the pixel defining layer defines a plurality of sub-pixel openings, an accommodation groove is provided at a surface of the pixel defining layer facing away from the base substrate, and the accommodation groove is located between two adjacent sub-pixel openings.

16 Claims, 3 Drawing Sheets

(56) References Cited

U.S. PATENT DOCUMENTS

2009/0215350 A1    8/2009   Takei et al.
2013/0099221 A1    4/2013   Kawamura et al.

FOREIGN PATENT DOCUMENTS

| CN | 108538892 A | 9/2018 |
| CN | 110112203 A | 8/2019 |
| KR | 20050052595 A | 3/2005 |

OTHER PUBLICATIONS

Search Report Issued with First Official Action in Chinese Patent Application No. 201910461711.1, dated (2019).

* cited by examiner

DISPLAY BACKPLATE AND MANUFACTURING METHOD THEREOF, AND DISPLAY DEVICE

This application is a U.S. National Phase Entry of International Application No. PCT/CN2020/077454 filed on Mar. 2, 2020, designating the United States of America and claiming priority to Chinese Patent Application No. 201910461711.1, filed on May 30, 2019. The present application claims priority to and the benefit of the above-identified applications and the above-identified applications are incorporated by reference herein in their entirety.

TECHNICAL FIELD

Embodiments of the present disclosure relate to a display backplate and a manufacturing method thereof, and a display device.

BACKGROUND

Ink-jet printing technology is one of the main development directions of OLED technology, because the ink-jet printing technology can significantly reduce the equipment and material costs of OLED technology. During an ink-jet printing process, due to the influence of process conditions, equipment fluctuations, and other conditions, the ink in plurality of sub-pixels is prone to overflow, which leads to color crossing between adjacent sub-pixels, thereby leading that the light emitted by one of the plurality of sub-pixel has a color of the light emitted by another of the plurality of sub-pixel adjacent to the one of the plurality of sub-pixel, or leading that one of the plurality of sub-pixel does not emit light, which seriously affects the quality of the display device.

SUMMARY

According to embodiments of the disclosure, a display backplate is provided. The display backplate comprises: a base substrate; and a pixel defining layer, provided on the base substrate. The pixel defining layer defines a plurality of sub-pixel openings, an accommodation groove is provided at a surface of the pixel defining layer facing away from the base substrate, and the accommodation groove is located between two adjacent sub-pixel openings of the plurality of sub-pixel openings.

For example, the plurality of sub-pixel openings are distributed in rows and columns, and the accommodation groove is located between two adjacent rows of the plurality of sub-pixel openings or the accommodation groove is located between two adjacent columns of the plurality of sub-pixel openings.

For example, a length direction of the accommodation groove is along an extension direction of short sides of the plurality of sub-pixel openings.

For example, a portion of the pixel defining layer located between the accommodation groove and one of the plurality of sub-pixel openings, which are adjacent to each other, comprises a first portion and a second portion, the first portion is closer to the one of the plurality of sub-pixel openings than the second portion, the second portion is closer to the accommodation groove than the first portion, and a lyophilicity of a surface of the second portion facing away from the base substrate is better than a lyophilicity of a surface of the first portion facing away from the base substrate.

For example, a lyophilicity of an inner surface of the accommodation groove is better than the lyophilicity of the surface of the first portion facing away from the base substrate.

For example, the pixel defining layer comprises a lyophobic layer and a lyophilic layer, the lyophobic layer is provided on the base substrate, the lyophobic layer defines the plurality of sub-pixel openings and a plurality of openings for arranging the lyophilic layer, each of the plurality of openings for arranging the lyophilic layer is located between the two adjacent sub-pixel openings of the plurality of sub-pixel openings, the lyophilic layer is provided in the plurality of openings for arranging the lyophilic layer, and the accommodation groove is provided in the lyophilic layer.

For example, a surface of the lyophobic layer facing away from the base substrate is flush with a surface of the lyophilic layer facing away from the base substrate.

For example, the lyophilic layer covers at least a portion of a surface of the lyophobic layer facing away from the base substrate.

For example, a distance between an edge of the lyophilic layer close to one of the plurality of sub-pixel openings and an edge of the lyophobic layer close to the one of the plurality of the sub-pixel openings is 0-20 microns.

For example, a thickness of a portion of the lyophilic layer covering the surface of the lyophobic layer facing away from the base substrate is 0-2 microns.

For example, a contact angle of the lyophilic layer is less than 35°, and a contact angle of the lyophobic layer is larger than 40°.

For example, a material of the lyophobic layer comprises one or more selected from the group consisting of fluorine-containing polyimide and fluorine-containing resin, and a material of the lyophilic layer comprises one or more selected from the group consisting of ester compounds, ether compounds, and polyimide compounds.

For example, a thickness of the lyophilic layer is 0.2-3.5 microns, and a thickness of the lyophobic layer is 0.2-3 microns.

According to the embodiments of the disclosure, a manufacturing method of a display backplate is provided, comprising: forming a pixel defining layer on a base substrate, wherein the pixel defining layer defines a plurality of sub-pixel openings; and forming an accommodation groove in the pixel defining layer between two adjacent sub-pixel openings of the plurality of sub-pixel openings.

For example, the method further comprises: forming a lyophobic layer on the base substrate, wherein the lyophobic layer defines the plurality of sub-pixel openings and a plurality of openings for arranging a lyophilic layer, and each of the plurality of openings for arranging the lyophilic layer is located between the two adjacent sub-pixel openings of the plurality of sub-pixel openings; forming a lyophilic layer in the plurality of openings for arranging the lyophilic layer, wherein the lyophobic layer and the lyophilic layer constitute the pixel defining layer; and forming the accommodation groove in the lyophilic layer.

According to the embodiments of the disclosure, a display device is provided, comprising: the display backplate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed. Expressions such as "connect" or "interconnect" and the like are not limited to physical or mechanical connections, but may include electrical connections, whether direct or indirect.

If specific technology or specific conditions are not indicated in the embodiments of the present disclosure, the technology or the conditions described in the literatures in the field or the product specifications may be referred to. The used reagents or the used instruments without indicating the manufacturer are products that can be obtained through market purchase.

Figure 1:
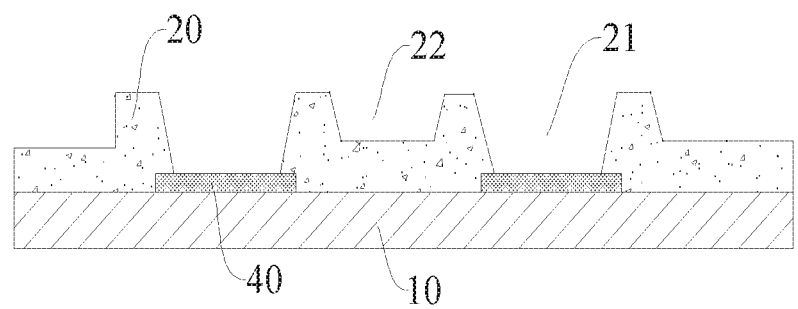
FIG. 1 is a schematic cross-sectional structural view of a display backplate according to embodiments of the present disclosure.

Embodiments of the present disclosure provide a display backplate. According to the embodiments of the present disclosure, referring to FIG. 1, the display backplate includes a base substrate 10 and a pixel defining layer 20 arranged on the base substrate 10. The pixel defining layer 20 defines a plurality of sub-pixel openings 21, and an accommodation groove 22 is arranged at a surface of the pixel defining layer 20 facing away from the base substrate 10, and the accommodation groove 22 is located between two adjacent sub-pixel openings 21. Therefore, in the case where an ink-jet printing process is carried out to form a light-emitting layer, an ink overflowing from the plurality of sub-pixel openings 21 flows into the accommodation groove 22, thereby effectively avoiding the occurrence of color crossing between adjacent sub-pixels, effectively reducing the process defects, improving the production yield, reducing the distance between adjacent sub-pixel openings 21, and improving the display resolution and the display quality. For example, the accommodation groove 22 is recessed toward the base substrate 10 from the surface of the pixel defining layer 20 facing away from the base substrate 10, and the accommodation groove 22 does not penetrate through the pixel defining layer 20.

It should be noted that the term "base substrate" used in the embodiments of the present disclosure should be broadly understood, the base substrate for example include a base, and circuit structures (such as thin film transistors, etc.), insulation layers (such as a gate insulation layer, an inter-layer insulation layer, a resin layer, etc.) and the like that are formed on the base, and the specific structures of the base substrate may be selected according to actual requirements, which will not be described in detail here. For example, a first electrode of a light-emitting element is formed before forming the pixel defining layer 20, and therefore, a first electrode 40 for example is arranged at the bottom of the plurality of sub-pixel openings 21. For example, the first electrode 40 is an anode electrode.

According to the embodiments of the present disclosure, the arrangement manner of the plurality of sub-pixel openings 21 is not particularly limited. For example, referring to FIG. 2, the plurality of sub-pixel openings 21 are distributed in rows and columns, the accommodation groove 22 is located between two adjacent rows of the plurality of sub-pixel openings 21 and/or the accommodation groove 22 is located between two adjacent columns of the plurality of sub-pixel openings 21. Therefore, the structure of the accommodation groove 22 is simple, the manufacturing process thereof is simple, and one accommodation groove 22 for example is configured to accommodate the ink overflowing from a plurality of sub-pixel openings.

Figure 2:
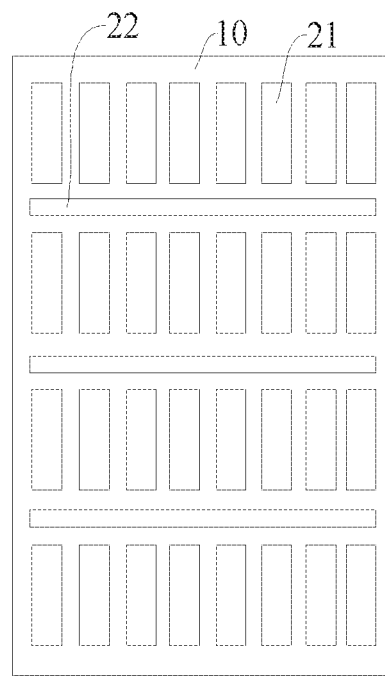
FIG. 2 is a schematic planar structural view of the display backplate according to the embodiments of the present disclosure.

According to the embodiments of the present disclosure, referring to FIG. 2, a length direction of the accommodation groove 22 is along an extension direction of short sides of the two adjacent sub-pixel openings 21 of the plurality of sub-pixel openings 21. For example, a gap between the short sides of two adjacent sub-pixel openings is relatively large, so that the above arrangement manner makes full use of the gap between the short sides of two adjacent sub-pixel openings without adversely affecting the resolution and aperture ratio of the display backplate.

Figure 3:
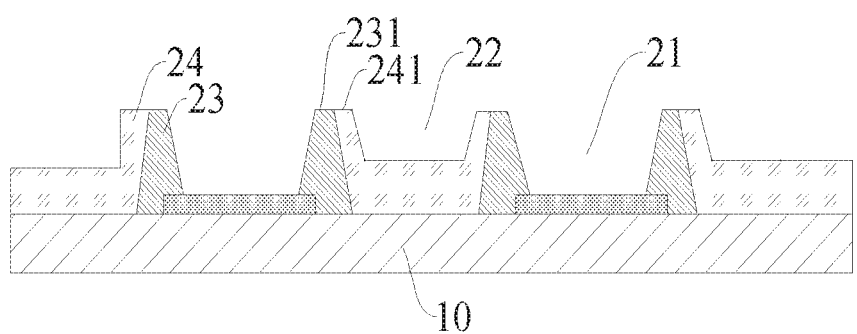
FIG. 3 is another schematic cross-sectional structural view of the display backplate according to the embodiments of the present disclosure.

According to the embodiments of the present disclosure, referring to FIG. 3, a portion of the pixel defining layer 20 located between the accommodation groove 22 and one of the plurality of sub-pixel openings 21, which are adjacent to each other, comprises a first portion 23 and a second portion 24, the first portion 23 is closer to the one of the plurality of sub-pixel openings 21 than the second portion 24, the second portion 24 is closer to the accommodation groove 22 than the first portion 23, and a lyophilicity of a surface 241 of the second portion 24 facing away from the base substrate 10 is better than a lyophilicity of a surface of the first portion 23 facing away from the base substrate 10. Therefore, the surface 241 with better lyophilicity effectively guides the overflowing ink to flow into the accommodation groove 22 so that the overflowing ink does not flow into the adjacent sub-pixel opening. For example, further, a lyophilicity of an inner surface (that is, a sidewall surface and a bottom surface) of the accommodation groove 22 is better than the lyophilicity of the surface 231 of the first portion 23 facing away from the base substrate 10.

Figure 4:
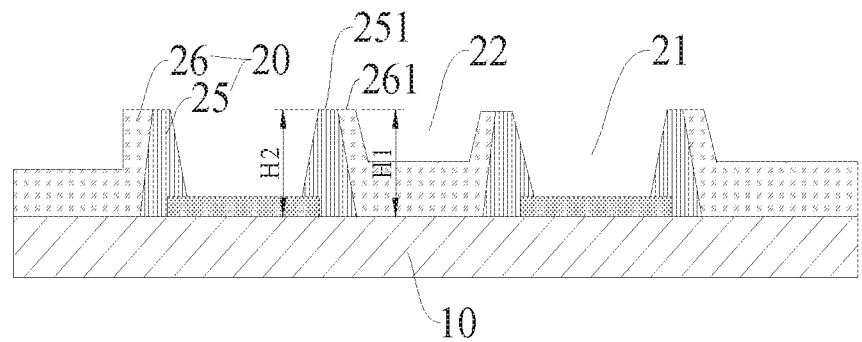
FIG. 4 is another schematic cross-sectional structural view of the display backplate according to the embodiments of the present disclosure.

According to the embodiments of the present disclosure, referring to FIG. 4, the pixel defining layer 20 includes a lyophobic layer 25 and a lyophilic layer 26, the lyophobic layer 25 is arranged on the base substrate 10, and the lyophobic layer 25 defines the plurality of sub-pixel openings 21 and a plurality of openings 27 for arranging the lyophilic layer 26. Each of the plurality of openings 27 for arranging the lyophilic layer 26 is located between two adjacent sub-pixel openings 21, the lyophilic layer 26 is arranged in the plurality of openings 27 for arranging the lyophilic layer 26, and the accommodation groove 22 is arranged in the lyophilic layer 26. Therefore, by arranging the lyophobic layer and the lyophilic layer, the affinity between the overflowing ink and the lyophilic layer is stronger, and the overflowing ink is easier to flow to the lyophilic layer, so that overflowing ink is guided to flow into the accommodation groove 22, and the color crossing between adjacent sub-pixels is effectively avoided.

Figure 5:
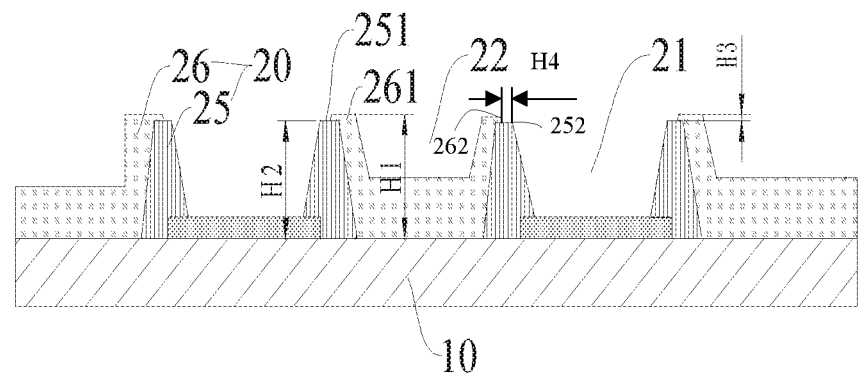
FIG. 5 is another schematic cross-sectional structural view of the display backplate according to the embodiments of the present disclosure.
Figure 6:
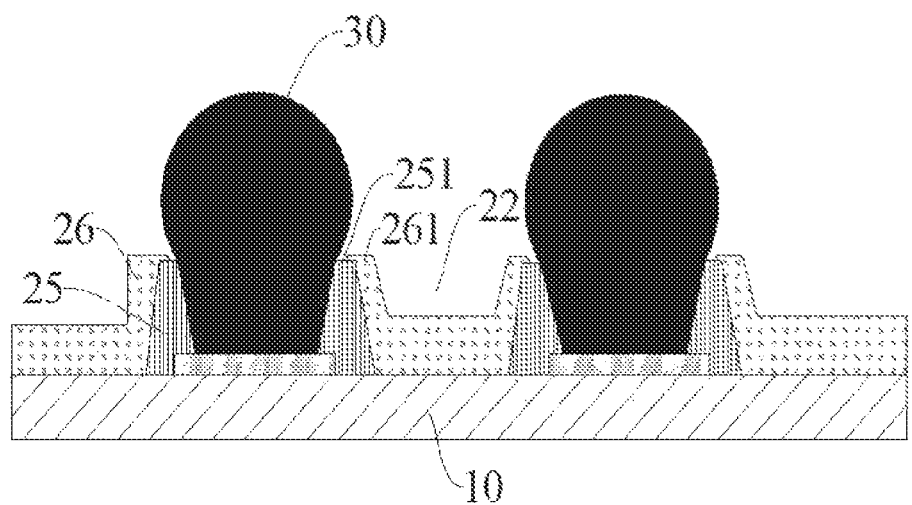
FIG. 6 is another schematic cross-sectional structural view of the display backplate according to the embodiments of the present disclosure.

According to the embodiments of the present disclosure, a thicknesses of the lyophilic layer and a thickness of the lyophobic layer are not limited. For example, the thickness of the lyophilic layer 26 is equal to the thickness of the lyophobic layer 25, and under this case, a surface 251 of the lyophobic layer 25 facing away from the base substrate 10 is flush with a surface 261 of the lyophilic layer 26 facing away from the base substrate 10 (refer to FIG. 4). For example, the thickness of the lyophilic layer 26 is larger than the thickness of the lyophobic layer 25, and under this case, the lyophilic layer 26 covers at least a portion of the surface 251 of the lyophobic layer 25 facing away from the base substrate 10 (refer to FIG. 5); therefore, the overflowing ink is better guided to flow into the accommodation groove 22. Those skilled in the art should understand that in the case where an ink 30 (for example, the ink 30 is used to form the light-emitting layer) overflows the sub-pixel opening, due to the effect of surface tension, a portion of the ink 30 located outside the sub-pixel opening is approximately in a spherical shape (refer to FIG. 6). In the case where the lyophilic layer 26 covers at least a portion of the surface 251 of the lyophobic layer 25 facing away from the base substrate 10, the overflowing portion of the ink 30 is more likely to contact with the lyophilic layer 26, so that the overflowing portion of the ink 30 is better to be guided into the accommodation groove 22. According to the embodiments of the present disclosure, because the overflowing portion of the ink 30 (for example, the ink 30 is used to form the light-emitting layer) flows into the accommodation groove 22, the overflowing portion, overflowing from the plurality of sub-pixel openings 21, of the ink 30 does not flow into the adjacent sub-pixel opening 21, so that the light-emitting layer provided in one of the plurality of sub-pixels does not extend to the adjacent sub-pixel, thereby preventing the occurrence of color crossing.

According to the embodiments of the present disclosure, for example, the thickness H1 of the lyophilic layer 26 is 0.2 to 3.5 microns, specifically, such as 0.2 microns, 0.3 microns, 0.4 microns, 0.5 microns, 0.6 microns, 0.7 microns, 0.8 microns, 0.9 microns, 1.0 microns, 1.1 microns, 1.2 microns, 1.3 microns, 1.4 microns, 1.5 microns, 1.6 microns, 1.7 microns, 1.8 microns, 1.9 microns, 2.0 microns, 2.1 microns, 2.2 microns, 2.3 microns, 2.4 microns, 2.5 microns, 2.6 Micron, 2.7 microns, 2.8 microns, 2.9 microns, 3.0 microns, 3.1 microns, 3.2 microns, 3.3 microns, 3.4 microns, 3.5 microns, etc. For example, the thickness H2 of the lyophobic layer 25 is 0.2 to 3 microns, specifically, such as 0.2 microns, 0.3 microns, 0.4 microns, 0.5 microns, 0.6 microns, 0.7 microns, 0.8 microns, 0.9 microns, 1.0 microns, 1.1 microns, 1.2 microns. , 1.3 microns, 1.4 microns, 1.5 microns, 1.6 microns, 1.7 microns, 1.8 microns, 1.9 microns, 2.0 microns, 2.1 microns, 2.2 microns, 2.3 microns, 2.4 microns, 2.5 microns, 2.6 microns, 2.7 microns, 2.8 microns, 2.9 Micron, 3.0 microns, etc. Within the above thickness range, the thickness H1 and the thickness H2 not only meet the requirements on the pixel defining layer, but also make it easier for the overflowing ink to flow into the accommodation groove 22, thus avoiding the color crossing problem between adjacent sub-pixels. If the thickness H1 and the thickness H2 are too thick, it is not helpful to obtain the thin and light display backplate.

According to the embodiments of the present disclosure, for example, in the case where the lyophilic layer 26 covers at least a portion of the surface 251 of the lyophobic layer 25 facing away from the base substrate 10, a thickness H3 of a portion of the lyophilic layer 26 covering the surface 251 of the lyophobic layer 25 facing away from the base substrate 10 is 0 to 2 microns, specifically, such as 0.1 microns, 0.2 microns, 0.3 microns, 0.4 microns, 0.5 microns, 0.6 microns, 0.7 microns, 0.8 microns, 0.9 microns, 1.0 microns, 1.1 microns, 1.2 microns, 1.3 microns, 1.4 microns, 1.5 microns, 1.6 microns, 1.7 microns, 1.8 microns, 1.9 microns, 2.0 microns, etc. Within the above thickness range, the lyophilic layer 26 is easier to contact with the ink overflowing the plurality of sub-pixel openings 21, and then to guide the ink to flow into the accommodation groove 22. If the thickness H3 is too thin or too thick, the effect for guiding the ink is somewhat weakened.

According to the embodiments of the present disclosure, for example, a distance H4 between an edge 262 of the lyophilic layer 26 close to the sub-pixel opening 21 and an edge 252 of the lyophobic layer 25 close to the sub-pixel opening 21 is 0 to 20 microns, specifically, such as 1 microns, 2 microns, 3 microns, 4 microns, 5 microns, 6 microns, microns, 8 microns, 9 microns, 10 microns, 11 microns, 12 microns, 13 microns, 14 microns, 15 microns, 16 microns, 17 microns, 18 microns, 19 microns, 20 microns, etc.

According to the embodiments of the present disclosure, a contact angle of the lyophilic layer 26 is less than 35° (specifically, such as 1°, 5°, 10°, 15°, 20°, 25°, 30°, 34°, etc.), and a contact angle of the lyophobic layer 25 is larger than 40° (specifically, such as 41°, 45°, 50°, 55°, 60°, 65°, 70°, 75°, 80°, 85°, 90°, 100°, 110°, 115°, 120°, 125°, 130°, etc.). Within the above contact angle range, the contact angles not only meet the performance requirements on the pixel defining layer, but also better guide the overflowing ink to flow into the accommodation groove 22. For example, the contact angle of the lyophilic layer 26 is a contact angle for the ink used to form the light-emitting layer with respect to the lyophilic layer 26, and the contact angle of the lyophobic layer 25 is a contact angle for the ink used to form the light-emitting layer with respect to the lyophobic layer 25.

According to the embodiments of the present disclosure, for example, a material for forming the lyophobic layer 25 includes one or more selected from the group consisting of fluorine-containing polyimide and fluorine-containing resin, and a material for forming the lyophilic layer includes one or more selected from the group consisting of ester compounds, ether compounds, and polyimide compounds. For example, a main component of fluorine-containing polyimide is polyimide and contains a fluorine-containing additive. Of course, other functional additives may be included as required. The above materials have proper hydrophilicity and proper hydrophobicity, which meet the requirements of the pixel defining layer and meet the requirements for guiding the overflowing ink. Moreover, the above materials have wide sources and low cost, and are easy to realize industrial production.

According to the embodiments of the present disclosure, in addition to the structures and components described above, the display backplate may include other necessary structures and components of the display backplate, such as the light-emitting layer arranged on a surface of the first electrode 40 facing away from the base substrate, a second electrode arranged on a surface of the light-emitting layer facing away from the base substrate, etc. The specific structures of the display backplate may be designed according to actual requirements, and will not be described in detail here. For example, the second electrode is a cathode electrode.

Figure 7:
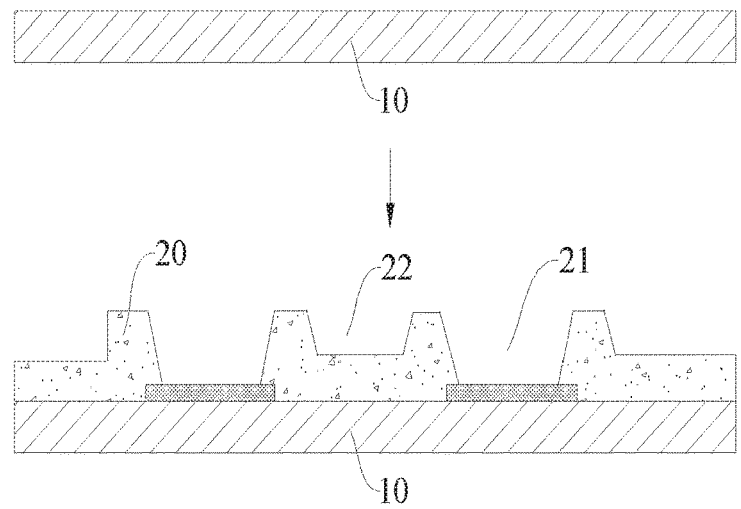
FIG. 7 is a flowchart of a manufacturing method of a display backplate according to the embodiments of the present disclosure.

The embodiments of the present disclosure further provide a manufacturing method of the above described display backplate. According to the embodiments of the present disclosure, referring to FIG. 7, the method includes forming a pixel defining layer 20 on a base substrate 10, in which the pixel defining layer 20 defines a plurality of sub-pixel openings 21; forming an accommodation groove 22 in the pixel defining layer 20 between two adjacent sub-pixel openings 21. With this method, the above described display backplate is manufactured quickly and conveniently with simple steps and easy operation and without strict requirements on equipment and operators. In the process of forming the light-emitting layer, the overflowing portion of the ink for forming the light-emitting layer flows into the accommodation groove 22, thus effectively avoiding the color crossing problem of adjacent sub-pixels, avoiding process defects, improving the production yield, and obtaining the display backplate with better display effect.

According to the embodiments of the present disclosure, the method of forming the pixel defining layer for example is photolithography, etc. For example, an insulation film and a photoresist film are sequentially formed on the base substrate, then the photoresist film is exposed by using a mask, then the exposed photoresist film is developed to obtain a photoresist pattern, then a portion of the insulation film not covered by the photoresist pattern is etched to form the pixel defining layer with the plurality of sub-pixel openings, and then the patterned photoresist is removed to obtain the pixel defining layer.

According to the embodiments of the present disclosure, the method of forming the accommodation groove is not particularly limited, and may be any process that forms the accommodation groove in the pixel defining layer; for example, the accommodation groove is formed by wet etching, dry etching, laser etching or other any proper processes.

Figure 8:
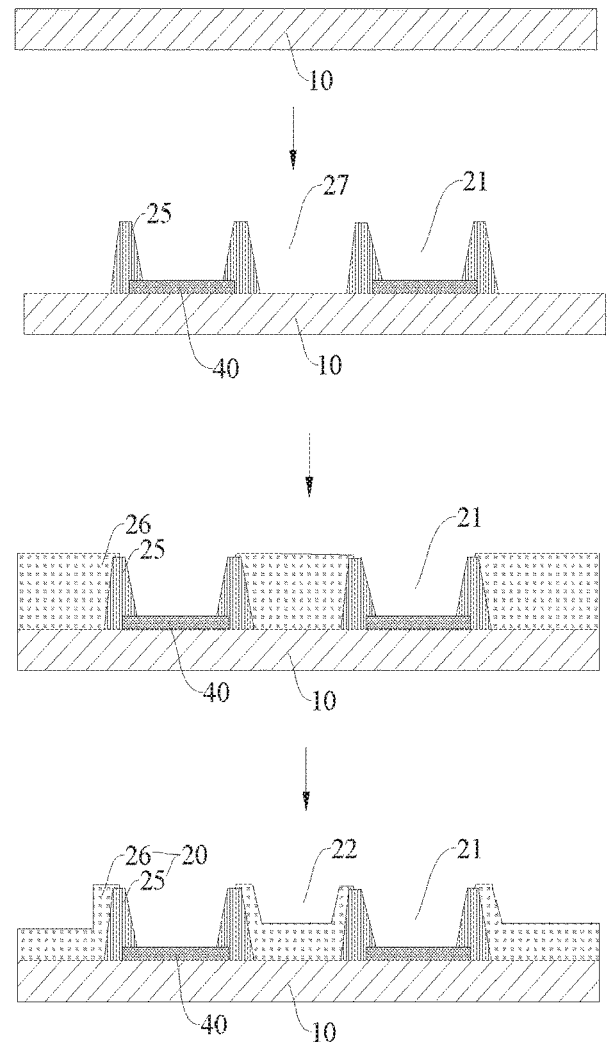
FIG. 8 is another flowchart of the manufacturing method of the display backplate according to the embodiments of the present disclosure.

According to the embodiments of the present disclosure, referring to FIG. 8, the above method for example includes: forming a lyophobic layer 25 on the base substrate, in which the lyophobic layer 25 defines the plurality of sub-pixel openings 21 and a plurality of openings 27 for arranging a lyophilic layer, and each of the plurality of openings 27 for arranging the lyophilic layer is located between two adjacent sub-pixel openings 21 of the plurality of sub-pixel openings 21; forming the lyophilic layer 26 in the plurality of openings 27 for arranging the lyophilic layer, in which the lyophobic layer 25 and the lyophilic layer 26 constitute the pixel defining layer 20; forming the accommodation groove 22 in the lyophilic layer 26.

According to the embodiments of the present disclosure, each of the lyophobic layer and the lyophilic layer for example is formed by a photolithography method. For example, a lyophobic film and a photoresist film are sequentially formed on the base substrate, then the photoresist film is exposed by using a mask, then the exposed photoresist film is developed to obtain a photoresist pattern, then a portion of the lyophobic film not covered by photoresist pattern is etched to obtain the lyophobic layer, then the photoresist pattern is removed; and then a lyophilic film and another photoresist film are formed, and the steps of exposure, development, etching, and photoresist removal are sequentially performed to obtain the lyophobic layer.

Those skilled in the art should understand that in addition to the above steps, the manufacture method of the display backplate may include the steps of forming other components of the display backplate, such as the step of forming a circuit structure (such as thin film transistors), the step of forming a first electrode, a light-emitting layer, and a second electrode, etc., which may be carried out according to actual requirements and will not be described in detail here.

The embodiments of the present disclosure further provide a display device. According to the embodiments of the present disclosure, the display device includes the above described display backplate. The display device has all the features and advantages of the above described display backplate, which will not be repeated here.

It should be understood by those skilled in the art that, in addition to the above described display backplate, the display device includes other structures and components, such as an encapsulation layer, a cover plate, etc., which will not be described in detail here. In addition, the specific type of the display device is not particularly limited, which includes but is not limited to a display panel, a mobile phone, a tablet computer, a television, a monitor, a picture screen, a game machine, a wearable device, etc.

The foregoing embodiments merely are exemplary embodiments of the disclosure, and not intended to define the scope of the disclosure, and the scope of the disclosure is determined by the appended claims.

What is claimed is:

1. A display backplate, comprising:
a base substrate; and
a pixel defining layer, provided on the base substrate,
wherein the pixel defining layer defines a plurality of sub-pixel openings, an accommodation groove is provided at a surface of the pixel defining layer facing away from the base substrate, and the accommodation groove is located between two adjacent sub-pixel openings of the plurality of sub-pixel openings;
wherein the pixel defining layer comprises a lyophobic layer and a lyophilic layer, the lyophobic layer is provided on the base substrate, the lyophobic layer defines the plurality of sub-pixel openings and a plurality of openings for arranging the lyophilic layer, each of the plurality of openings for arranging the lyophilic layer is located between the two adjacent sub-pixel openings of the plurality of sub-pixel openings, the lyophilic layer is provided in the plurality of openings for arranging the lyophilic layer, and the accommodation groove is provided in the lyophilic layer.

2. The display backplate according to claim 1, wherein the plurality of sub-pixel openings are distributed in rows and columns, and the accommodation groove is located between two adjacent rows of the plurality of sub-pixel openings and/or the accommodation groove is located between two adjacent columns of the plurality of sub-pixel openings.

3. The display backplate according to claim 1, wherein a length direction of the accommodation groove is along an extension direction of short sides of the plurality of sub-pixel openings.

4. The display backplate according to claim 1, wherein a surface of the lyophobic layer facing away from the base substrate is flush with a surface of the lyophilic layer facing away from the base substrate.

5. The display backplate according to claim 1, wherein the lyophilic layer covers at least a portion of a surface of the lyophobic layer facing away from the base substrate.

6. The display backplate according to claim 1, wherein a distance between an edge of the lyophilic layer close to one of the plurality of sub-pixel openings and an edge of the lyophobic layer close to the one of the plurality of the sub-pixel openings is 0-20 microns.

7. The display backplate according to claim 5, wherein a thickness of a portion of the lyophilic layer covering the surface of the lyophobic layer facing away from the base substrate is 0-2 microns.

8. The display backplate according to claim 1, wherein a contact angle of the lyophilic layer is less than 35°, and a contact angle of the lyophobic layer is larger than 40°.

9. The display backplate according to claim 1, wherein a material of the lyophobic layer comprises one or more selected from the group consisting of fluorine-containing polyimide and fluorine-containing resin, and a material of the lyophilic layer comprises one or more selected from the group consisting of ester compounds, ether compounds, and polyimide compounds.

10. The display backplate according to claim 1, wherein a thickness of the lyophilic layer is 0.2-3.5 microns, and a thickness of the lyophobic layer is 0.2-3 microns.

11. A display device, comprising: the display backplate according to claim 1.

12. A display backplate, comprising:
a base substrate; and
a pixel defining layer, provided on the base substrate, wherein the pixel defining layer defines a plurality of sub-pixel openings, an accommodation groove is provided at a surface of the pixel defining layer facing away from the base substrate, and the accommodation groove is located between two adjacent sub-pixel openings of the plurality of sub-pixel openings; and wherein a portion of the pixel defining layer located between the accommodation groove and one of the plurality of sub-pixel openings, which are adjacent to each other, comprises a first portion and a second portion, the first portion is closer to the one of the plurality of sub-pixel openings than the second portion, the second portion is closer to the accommodation groove than the first portion, and a lyophilicity of a surface of the second portion facing away from the base substrate is better than a lyophilicity of a surface of the first portion facing away from the base substrate.

13. The display backplate according to claim 12, wherein a lyophilicity of an inner surface of the accommodation groove is better than the lyophilicity of the surface of the first portion facing away from the base substrate.

14. The display backplate according to claim 12, wherein the plurality of sub-pixel openings are distributed in rows and columns, and the accommodation groove is located between two adjacent rows of the plurality of sub-pixel openings and/or the accommodation groove is located between two adjacent columns of the plurality of sub-pixel openings.

15. The display backplate according to claim 12, wherein a length direction of the accommodation groove is along an extension direction of short sides of the plurality of sub-pixel openings.

16. A manufacturing method of a display backplate, comprising:
forming a pixel defining layer on a base substrate, wherein the pixel defining layer defines a plurality of sub-pixel openings; and
forming an accommodation groove in the pixel defining layer between two adjacent sub-pixel openings of the plurality of sub-pixel openings,
wherein the manufacturing method further comprise:
forming a lyophobic layer on the base substrate, wherein the lyophobic layer defines the plurality of sub-pixel openings and a plurality of openings for arranging a lyophilic layer, and each of the plurality of openings for arranging the lyophilic layer is located between the two adjacent sub-pixel openings of the plurality of sub-pixel openings;
forming a lyophilic layer in the plurality of openings for arranging the lyophilic layer, wherein the lyophobic layer and the lyophilic layer constitute the pixel defining layer; and
forming the accommodation groove in the lyophilic layer.

\* \* \* \* \*